United States Patent
Chikamori et al.

(10) Patent No.: US 11,054,488 B2
(45) Date of Patent: Jul. 6, 2021

(54) MAGNETIC DETECTION APPARATUS, COIN RECOGNITION UNIT AND MAGNETIC DETECTION METHOD

(71) Applicant: GLORY LTD., Hyogo (JP)

(72) Inventors: Masafumi Chikamori, Hyogo (JP); Seiji Morikawa, Hyogo (JP); Daiki Yokoie, Hyogo (JP)

(73) Assignee: GLORY, LTD., Hyogo (JP)

(*) Notice: Subject to any disclaimer, the term of this patent is extended or adjusted under 35 U.S.C. 154(b) by 313 days.

(21) Appl. No.: 16/088,094

(22) PCT Filed: Mar. 23, 2017

(86) PCT No.: PCT/JP2017/011884
§ 371 (c)(1),
(2) Date: Sep. 25, 2018

(87) PCT Pub. No.: WO2017/164347
PCT Pub. Date: Sep. 28, 2017

(65) Prior Publication Data
US 2020/0300933 A1 Sep. 24, 2020

(30) Foreign Application Priority Data
Mar. 25, 2016 (JP) .............................. JP2016-062333

(51) Int. Cl.
*G01R 33/028* (2006.01)
*G07D 5/08* (2006.01)
*G01N 27/72* (2006.01)

(52) U.S. Cl.
CPC ........... *G01R 33/0283* (2013.01); *G07D 5/08* (2013.01); *G01N 27/72* (2013.01)

(58) Field of Classification Search
CPC ........ G01R 33/0283; G07D 5/08; G07D 5/00; G07D 2205/00; G01D 5/204; G01D 5/22; G01D 5/225; G01D 5/243; G01N 27/72
(Continued)

(56) References Cited

U.S. PATENT DOCUMENTS 5,078,252 A * 1/1992 Furuya ..................... G07D 5/02
                                                          194/318
5,293,980 A * 3/1994 Parker ..................... G07D 5/08
                                                          194/317
(Continued)

FOREIGN PATENT DOCUMENTS

| EP | 1503170 A1 | 2/2005 |
| EP | 2626839 A1 | 8/2013 |

(Continued)

OTHER PUBLICATIONS

International Search Report from International Application No. PCT/JP2017/011884 dated Jun. 27, 2017.
(Continued)

*Primary Examiner* — Christopher E Mahoney
(74) *Attorney, Agent, or Firm* — Brundidge & Stanger, P.C.

(57) ABSTRACT

Provided is a magnetic detection device (100) having a simple configuration and being capable of stably detecting fine portions of a coin. The magnetic detection device (100) comprises an excitation coil (LX) that generates an alternating magnetic field in a transport path for transporting a coin in a first direction, and a plurality of detection coils (L1, L2) that are arranged at a predetermined pitch in a second direction and that output a detection signal based on an induction voltage caused by the alternating magnetic field. Each of the plurality of detection coils (L1, L2) outputs a detection signal on the basis of the induction voltage induced by the alternating magnetic field, which changes (Continued)

due to the coin being transported along the transportation path.

21 Claims, 13 Drawing Sheets

(58) Field of Classification Search
USPC .......................................................... 324/457
See application file for complete search history.

(56) References Cited

U.S. PATENT DOCUMENTS

| | | | |
|---|---|---|---|
| 5,572,180 A * | 11/1996 | Huang | H01F 17/0013 336/200 |
| 5,743,372 A | 4/1998 | Furuya | |
| 7,073,654 B2 * | 7/2006 | Matubara | G07D 5/02 194/303 |
| 8,167,110 B2 * | 5/2012 | Hibari | G07D 5/08 194/317 |
| 2005/0051409 A1 * | 3/2005 | Howells | G07D 5/08 194/317 |
| 2005/0150741 A1 * | 7/2005 | Yamakawa | G07D 5/005 194/320 |
| 2009/0223778 A1 | 9/2009 | Hibari et al. | |
| 2020/0111276 A1 * | 4/2020 | Chikamori | G07D 5/08 |

FOREIGN PATENT DOCUMENTS

| | | |
|---|---|---|
| JP | 08-212416 A | 8/1996 |
| JP | 09-035113 A | 2/1997 |
| JP | 2002277440 A | 9/2002 |
| JP | 2003156307 A | 5/2003 |
| JP | 2004-333284 A | 11/2004 |
| JP | 2005-018301 A | 1/2005 |
| JP | 2007034586 A | 2/2007 |
| JP | 2009-026339 A | 2/2009 |
| JP | 2010-231705 A | 10/2010 |
| JP | 5178243 B2 | 4/2013 |

OTHER PUBLICATIONS

Extended European Search Report for 17770387.3 dated Nov. 15, 2019, 8 pages.

* cited by examiner

MAGNETIC DETECTION APPARATUS, COIN RECOGNITION UNIT AND MAGNETIC DETECTION METHOD

TECHNICAL FIELD

The present invention relates to a magnetic detection apparatus, a coin recognition unit and a magnetic detection method.

BACKGROUND ART

There has been conventionally known a coin recognition unit that transports coin by using a transport mechanism, and recognizes the denomination and authentication of the coin by using a magnetic sensor placed separately from a transport path (for example, refer to PTL 1).

In the above described conventional coin recognition unit, in order to detect a composite material structure such as bicolor coin, different magnetic sensors for the respective constituent members of the bicolor coin are respectively disposed. Subsequently, the bicolor coin is put to one side on the transport path and is transported, and detection of the bicolor coin is carried out by matching the timings of capturing the signals detected by the respective magnetic sensors.

CITATION LIST

Patent Literature

PTL 1
Japanese Patent No. 5178243

SUMMARY OF INVENTION

Technical Problem

In the art disclosed in PTL 1 already described, it is necessary to dispose the different magnetic sensors for the respective constituent members of bicolor coin, and it is further necessary to transport the bicolor coin by putting the bicolor coin on one side on the transport path at the time of detection of the bicolor coin. Consequently, there has been the problem that the configuration of the unit is complicated, and detection of fine portions of the bicolor coin is difficult.

Therefore, the present invention is made to solve the problem as described above, and has an object to provide a magnetic detection apparatus, a coin recognition unit and a magnetic detection method capable of detecting fine portions of coin stably while simplifying a configuration for detecting coin.

Solution to Problem

A magnetic detection apparatus according to an embodiment of an aspect of the present invention includes: an excitation coil that generates an AC magnetic field in a transport path on which coin is transported in a first direction; and a plurality of detecting coils disposed side by side at pitches set in advance in a second direction, and outputting detection signals based on an induced voltage by the AC magnetic field, in which the plurality of detecting coils respectively output detection signals, based on an inducted voltage induced by the AC magnetic field that is changed by the coin being transported on the transport path.

In the magnetic detection apparatus, the excitation coil is disposed at an opposite side to a transport path surface on which the coin is transported, of the transport path.

In the magnetic detection apparatus, the plurality of detecting coils include a plurality of reflection detecting coils disposed on an opposite side to a transport path surface on which the coin is transported, of the transport path.

In the magnetic detection apparatus, the plurality of detecting coils include a plurality of transmission detecting coils disposed on a transport path surface side on which the coin is transported, of the transport path.

In the magnetic detection apparatus, the plurality of detecting coils are disposed to be parallel with a transport path surface of the transport path, and the coin is transported such that a coin surface is parallel with a transport path surface of the transport path.

In the magnetic detection apparatus, the plurality of detecting coils are orthogonal to the first direction, and are parallel with a transport path surface of the transport path.

In the magnetic detection apparatus, the plurality of detecting coils are orthogonal to the first direction, and are perpendicular to a transport path surface of the transport path.

In the magnetic detection apparatus, the coin has a first portion and a second portion of a different material divided concentrically, the first portion being nearer to a central position and the second portion being at an outer side, and the respective plurality of detecting coils are disposed at pitches smaller than a width of the second portion in a radial direction.

In the magnetic detection apparatus, the pitches are 0.2 mm to 3.0 mm.

In the magnetic detection apparatus, the transport path is disposed to penetrate through an opening portion provided in a circuit board, and the excitation coil and the plurality of detecting coils are disposed in the circuit board.

In the magnetic detection apparatus, the plurality of detecting coils are disposed on a first circuit board surface of the circuit board.

In the magnetic detection apparatus, the plurality of detecting coils are also disposed on a second circuit board surface on a back side of the first circuit board surface of the circuit board.

In the magnetic detection apparatus, the circuit board has an AC power supply that supplies an AC voltage to the excitation coil.

In the magnetic detection apparatus, the plurality of detecting coils respectively output detection signals based on an induced voltage induced in accordance with the AC magnetic field at a time of a center of the coin passing through the opening portion of the circuit board.

In the magnetic detection apparatus, the excitation coil is wound to surround a plurality of detecting cores on which the plurality of detecting coils are respectively wound and the plurality of detecting coils.

In the magnetic detection apparatus, the excitation coil is a single coil.

In the magnetic detection apparatus, each of the plurality of detecting coils is configured by a wound type chip inductor.

In the magnetic detection apparatus, a width of the wound type chip inductor is 0.3 mm to 3.0 mm.

In the magnetic detection apparatus, the plurality of detecting coils are disposed on an entire width of the transport path.

A coin recognition unit according to an embodiment of an aspect of the present invention includes the magnetic detection apparatus.

A magnetic detection method according to an embodiment of an aspect of the present invention includes: generating an AC magnetic field in a transport path on which coin is transported in a first direction; and outputting detection signals based on an induced voltage by the AC magnetic field, by a plurality of detecting coils disposed side by side at pitches which are set in advance, in a second direction, in which in outputting the detection signals, the respective plurality of detecting coils output the detection signals based on an induced voltage induced by the AC magnetic field which is changed by the coin being transported through the transport path.

Advantageous Effects of Invention

According to the magnetic detection apparatus, the coin recognition unit and the magnetic detection method according to the present invention, the fine portions of coin can be stably detected while the configuration for detecting coin is simplified.

DESCRIPTION OF EMBODIMENTS

Hereinafter, embodiments of the present invention will be described with reference to the accompanying drawings.

First Embodiment

Figure 1:
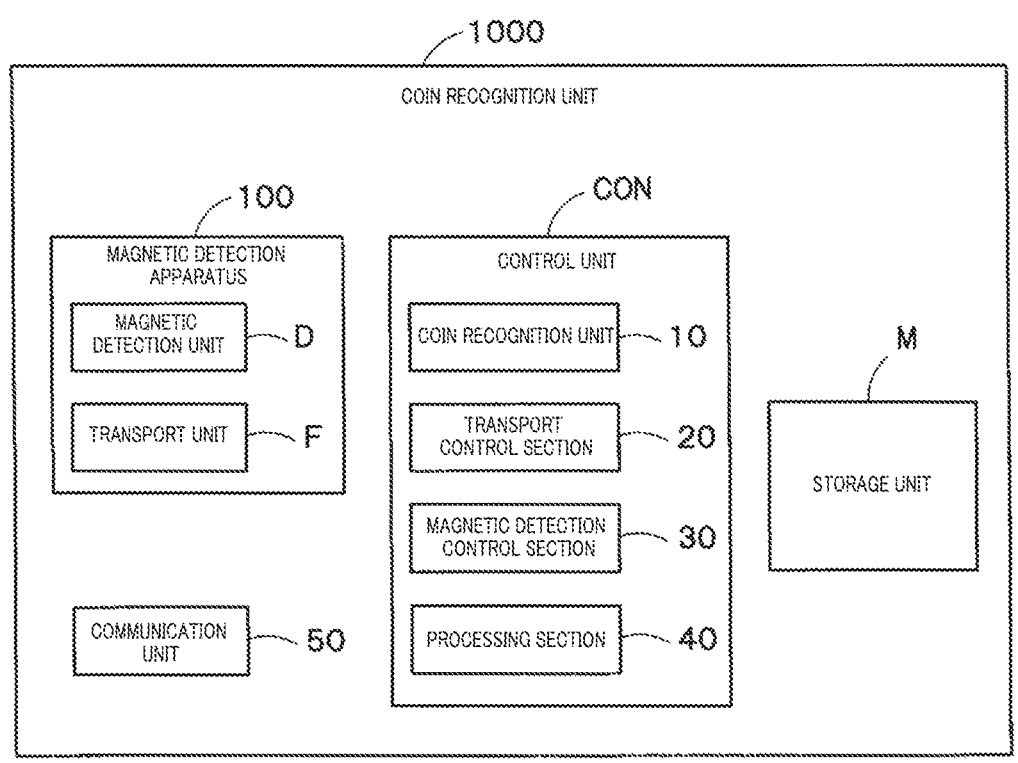
FIG. 1 is a diagram illustrating an example of a configuration of a coin recognition unit according to an embodiment that is one aspect of the present invention.
Figure 2:
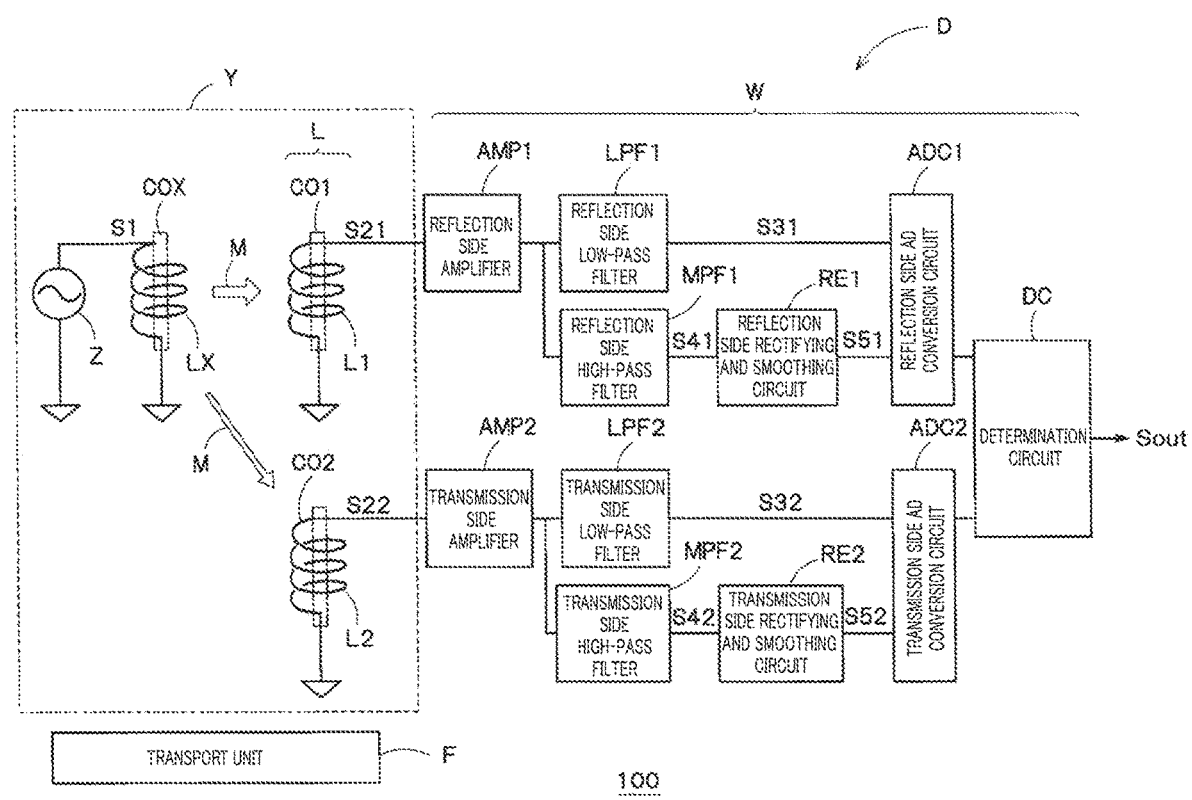
FIG. 2 is a diagram illustrating an example of a configuration of a magnetic detection apparatus illustrated in FIG. 1.
Figure 3:
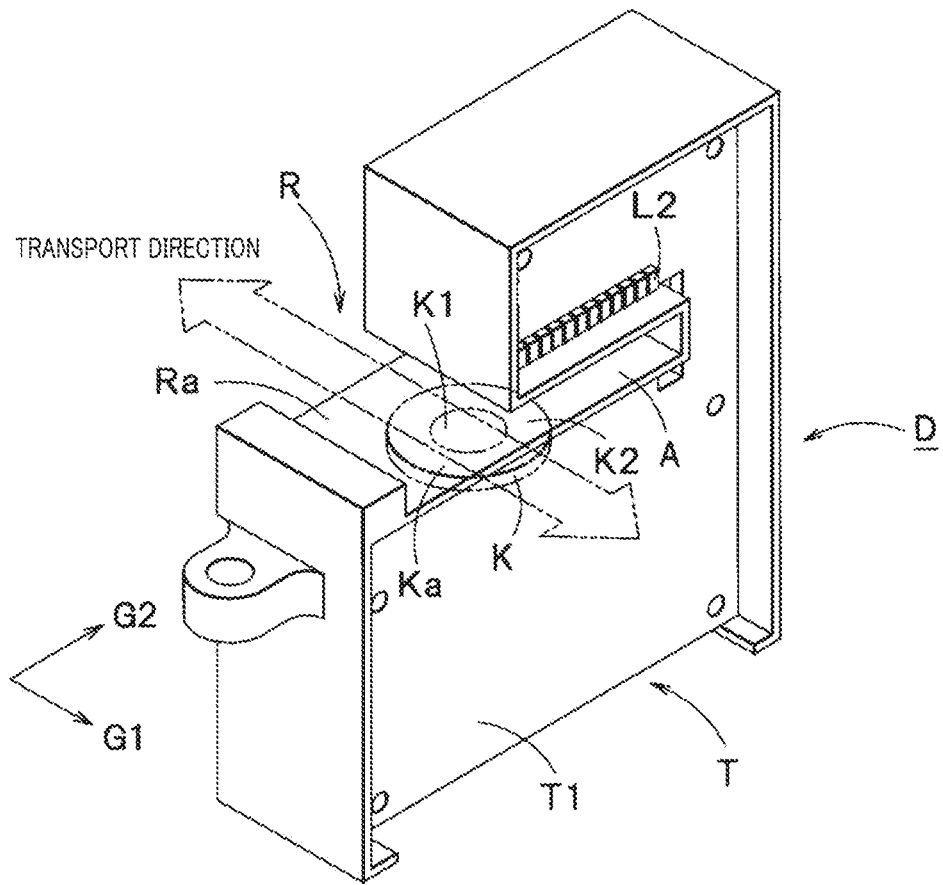
FIG. 3 is a perspective view illustrating an example of an outer appearance of the magnetic detection apparatus illustrated in FIG. 2.
Figure 4:
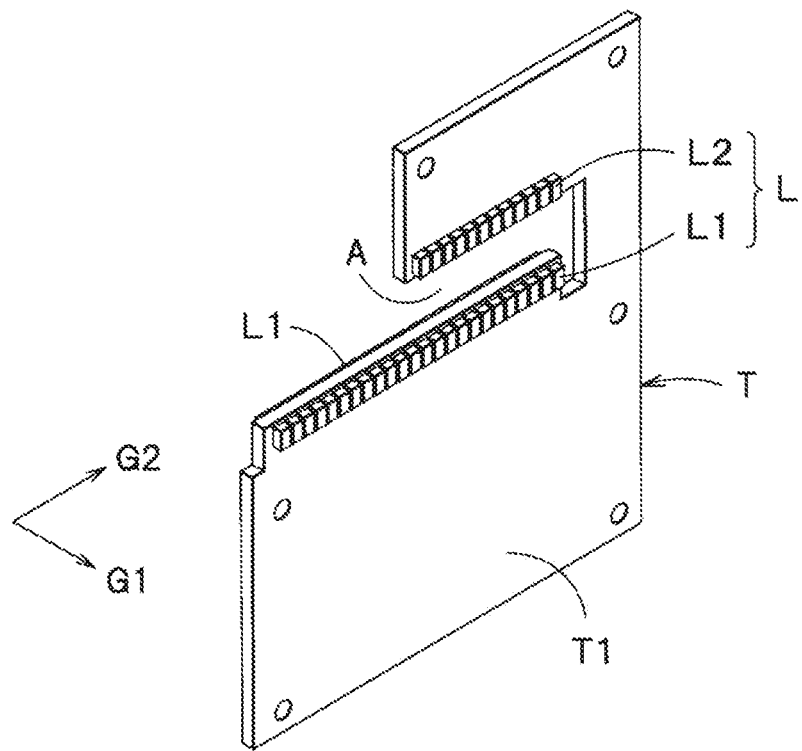
FIG. 4 is a perspective view illustrating an example of an outer appearance of a circuit board illustrated in FIG. 3.
Figure 5:
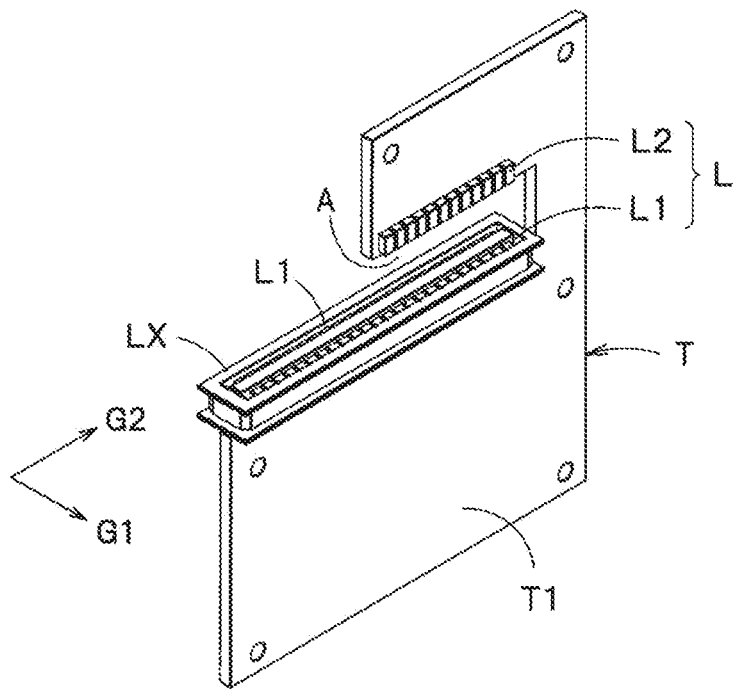
FIG. 5 is a perspective view illustrating an example of a configuration in which an excitation coil is disposed in the circuit board illustrated in FIG. 4.
Figure 6:
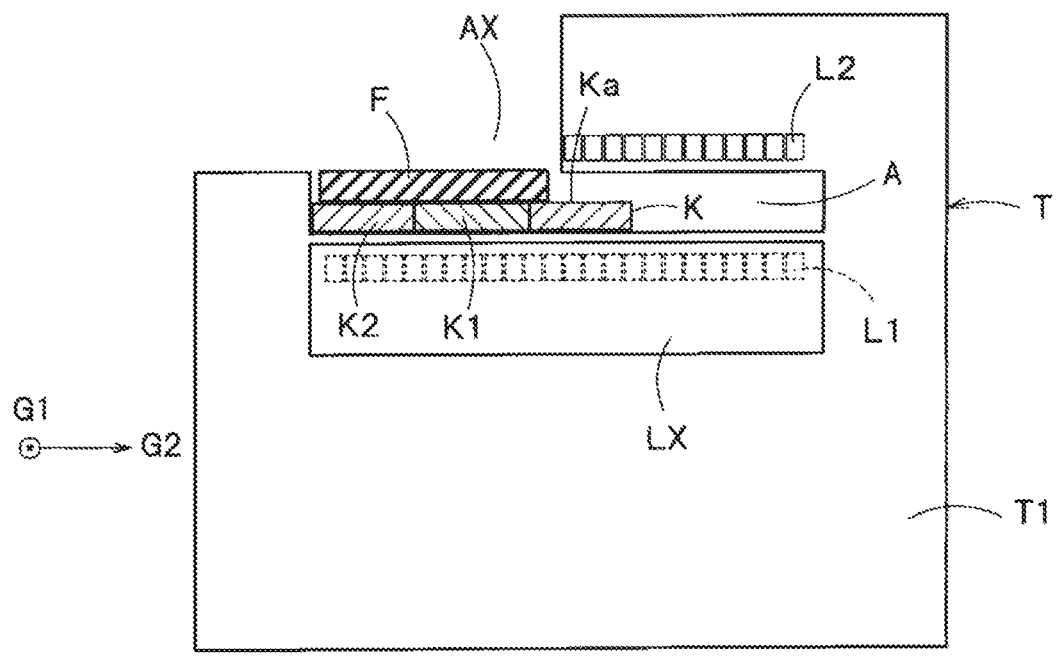
FIG. 6 is a schematic view of the configuration in which the excitation coil is disposed in the circuit board illustrated in FIG. 4 seen from a first direction.
Figure 7:
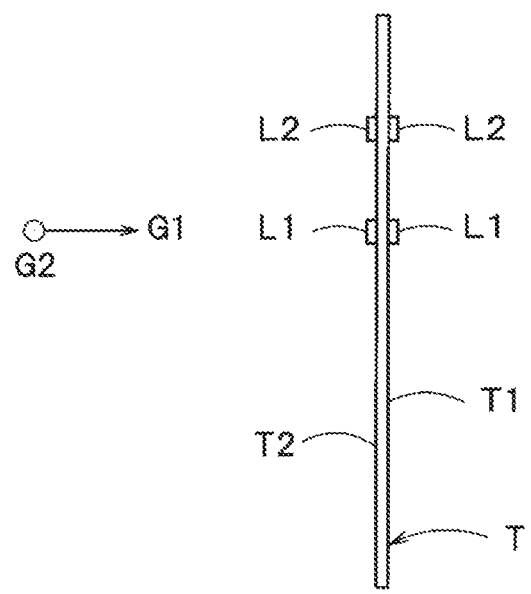
FIG. 7 is a schematic view illustrating an example of a configuration of the circuit board illustrated in FIG. 4 seen from a second direction.
Figure 8:
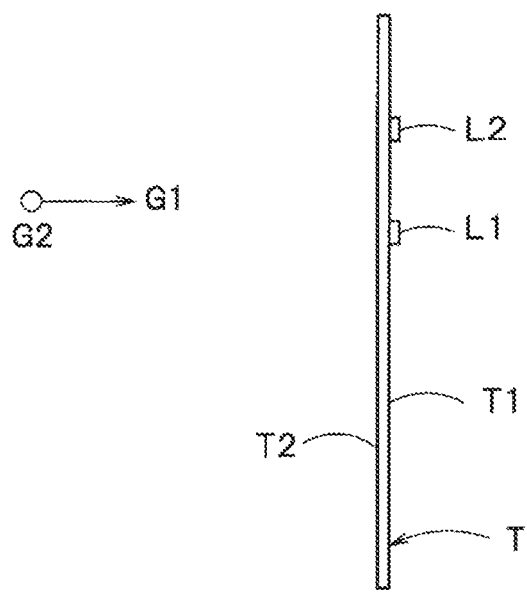
FIG. 8 is a schematic view illustrating another example of the configuration of the circuit board illustrated in FIG. 4 seen from the second direction.

FIG. 1 is a diagram illustrating an example of a configuration of coin recognition unit 1000 according to an embodiment that is one aspect of the present invention. FIG. 2 is a diagram illustrating an example of a configuration of magnetic detection apparatus 100 illustrated in FIG. 1. FIG. 3 is a perspective view illustrating an example of an outer appearance of magnetic detection apparatus 100 illustrated in FIG. 2. FIG. 4 is a perspective view illustrating an example of an outer appearance of circuit board T illustrated in FIG. 3. FIG. 5 is a perspective view illustrating an example of a configuration in which excitation coil LX is disposed in circuit board T illustrated in FIG. 4. FIG. 6 is a schematic view of the configuration in which excitation coil LX is disposed in circuit board T illustrated in FIG. 4, seen from first direction G1. FIG. 7 is a schematic view illustrating an example of a configuration of circuit board T illustrated in FIG. 4 seen from second direction G2. FIG. 8 is a schematic view illustrating another example of the configuration of circuit board T illustrated in FIG. 4 seen from second direction G2.

As illustrated in FIG. 1, coin recognition unit 1000 includes magnetic detection apparatus 100, control unit CON, storage unit M and communication unit 50.

Magnetic detection apparatus 100 applies a magnetic field to coin K that is transported on a transport path, and outputs determination signal Sout (FIG. 2) based on a detection signal based on an induced voltage by the magnetic field.

Control unit CON controls magnetic detection apparatus 100, and recognizes a kind of coin K which is an object to be detected, based on determination signal Sout which is outputted by magnetic detection unit D (determination circuit DC in FIG. 2) of magnetic detection apparatus 100.

Control unit CON includes coin recognition unit 10, transport control section 20, magnetic detection control section 30 and processing section 40, as illustrated in FIG. 1, for example.

For example, coin recognition unit 10 has a function of determining the kind of coin K by comparing determination signal Sout with a reference value or the like stored in storage unit M in advance concerning coin K to be an object to be detected. Coin K is, for example, coin of a single material, bicolor coin formed of an annular ring portion of a first metal (alloy) and a core portion of a second metal (alloy) different from the ring portion inside in a diameter direction of the annular ring portion of the first metal (alloy), clad coin including a laminar structure of metals (alloys) of different materials or the like. Hereinafter, a case where coin K is a bicolor coin will be described as an example.

Control unit CON is configured by, for example, software programs for realizing various kinds of processing, a CPU executing the software programs, various kinds of hardware controlled by the CPU, and the like. In order to store software programs and data that are necessary for operations of respective sections, storage unit M, a memory such as a RAM and a ROM and a hard disk dedicatedly provided separately are used.

Transport control section 20 controls transport unit F of magnetic detection apparatus 100, transport unit F transporting coin K which is an object to be detected.

Magnetic detection control section 30 controls magnetic detection unit D and transport unit F of magnetic detection apparatus 100.

Processing section 40 executes various kinds of processing required for operations of respective sections.

Storage unit M is configured by a storage device such as a volatile or nonvolatile memory, or a hard disk, and is used for storing various data required for processing that is performed in coin recognition unit 1000.

Storage unit M stores a recognition result by control unit CON. Storage unit M stores various reference values that are used to perform determination processing and the like of coin K which is an object to be detected, and information related to the various reference values.

Communication unit 50 has a function of receiving a signal from outside of coin recognition unit 1000, and transmitting a signal to outside from coin recognition unit 1000.

By communication unit 50, for example, a signal from outside is received and operation setting of control unit CON is changed, processing of updating, adding and deleting the software programs and data which are stored in the storage unit M is performed, and a recognition result of coin K that is an object to be detected by coin recognition unit 1000 can be output to outside.

Here, as illustrated in FIG. 2 and FIG. 3, magnetic detection apparatus 100 transports coin K to first direction (transport direction) G1 of transport path R by transport unit F, applies a magnetic field to coin K, and outputs determination signal Sout based on detection signals based on an induced voltage by the magnetic field. In FIG. 2, one reflection detecting coil L1 and one transmission detecting coil L2 are shown for simplification. Respective components of processing section W are also provided correspondingly to respective reflection detecting coil L1 and transmission detecting coil L2. In FIG. 3, transport unit F and processing section W are omitted.

Magnetic detection apparatus 100 includes magnetic detection unit D and transport unit F, as illustrated in FIG. 1 and FIG. 2, for example.

Transport unit F of magnetic detection apparatus 100 transports coin K on transport path R in first direction G1, as illustrated in FIG. 3, for example. In particular, transport unit F transports coin K such that transport path surface Ra of transport path R and coin surface Ka of coin K are parallel with each other. Transport unit F includes a transport mechanism for transporting coin K. Transport unit F may put coin K on one side of transport path R and convey coin K, in accordance with necessity.

In an example of FIG. 6, transport unit F is disposed in area AX connecting to opening portion A and facing one side of transport path R.

Magnetic detection unit D of magnetic detection apparatus 100 includes sensor section (coin recognition magnetic sensor) Y and processing section W, as illustrated in FIG. 2, for example.

Sensor section Y of magnetic detection unit D includes, for example, AC power supply Z, excitation coil (primary coil) LX, and a plurality of detection coils (secondary coils) L (L1, L2) which are illustrated in FIG. 2, and circuit board (printed circuit board) T illustrated in FIG. 3. Circuit board T is omitted in FIG. 2.

AC power supply Z generates AC voltage S1. AC power supply Z is disposed in circuit board T illustrated in FIG. 3, for example. AC voltage S1 is an AC voltage (composite signal) including two characteristic frequencies, for example.

AC voltage (composite signal) S1 outputted by AC power supply Z is applied to excitation coil LX, and excitation coil LX generates magnetic field MF in transport path R (FIG. 2). Excitation coil LX is disposed under transport path R.

In the present embodiment, excitation coil LX is a single coil. The single coil is adopted as excitation coil LX in this way, and thereby a processing circuit can be simplified. That is, cross talk countermeasure or the like for a detection signal becomes unnecessary. Excitation coil LX may be configured by a plurality of coils (primary coils).

Excitation coil LX is wound so as to surround a plurality of detection cores CO1 on which a plurality of reflection detecting coils L1 are wound and the plurality of reflection detecting coils L1, as illustrated in FIG. 4, FIG. 5 and FIG. 6, for example. In this case, a plurality of detecting cores CO1 are substituted for excitation core COX illustrated in FIG. 2.

A plurality of detecting coils L (L1, L2) are disposed side by side at pitches set in advance in second direction G2, as illustrated in FIG. 4, for example. Second direction G2 is orthogonal to first direction G1 and is parallel with transport path surface Ra of transport path R (parallel with circuit board surfaces T1 and T2 of circuit board T).

A plurality of detecting coils L (L1, L2) induce an induced voltage by magnetic field MF which is generated by excitation coil LX, and output detection signals S21 and S22 based on the induced voltage. A plurality of detecting coils L (L1, L2) respectively output detection signals S21 and S22 based on an induced voltage that is induced by magnetic field MF which is changed as a result of coin K being transported on transport path R.

Here, coin K is transported by transport unit F previously described such that transport path surface Ra of transport path R and coin surface Ka of coin K are parallel with each other. A plurality of detecting coils L (L1, L2) are disposed parallel with transport path surface Ra of transport path R and side by side at the pitches set in advance in second direction G2.

A plurality of detecting coils L (L1, L2) include a plurality of reflection detecting coils L1 disposed under transport path R. Reflection detecting coil L1 is wound on detection core CO1 as illustrated in FIG. 2, for example.

Reflection detecting coil L1 induces an induced voltage by a magnetic field that is generated as a result of magnetic field MF generated by excitation coil LX being reflected on coin K which is being transported on transport path R, and outputs detection signal S21 based on the induced voltage.

A plurality of detecting coils L (L1, L2) include a plurality of transmission detecting coils L2 disposed above transport path R. Transmission detecting coil L2 is wound on detection core CO2 as illustrated in FIG. 2, for example.

The transmission detecting coil L2 induces an inducted voltage by a magnetic field generated as a result of magnetic field MF generated by excitation coil LX transmitting through coin K which is being transported on transport path R, and outputs detection signal S22 based on the induced voltage.

A plurality of detecting coils L (L1, L2) respectively output detection signals S21 and S22 based on an induced voltage induced in accordance with magnetic field MF at a time of at least a center of coin K passing through opening portion A of circuit board T.

Here, for example, when coin K is the bicolor coin previously described, coin K includes first portion (core portion) K1 formed of a first metal, and second portion (ring portion) K2 formed of a second metal different from the first metal, as illustrated in FIG. 3 and FIG. 6. A width of second portion K2 in a diameter direction of a section of coin K perpendicular to coin surface Ka is smaller than a width of first portion K1. The width of second portion K2 of coin K (the width in the diameter direction of the coin) is, for example, 3 mm or more.

Reflection detecting coil L1 and transmission detecting coil L2 are disposed side by side in second direction G2 at the pitches previously described which are smaller than the width of second portion K2 described above. The pitch is 0.2 mm to 3.0 mm, for example.

Thereby, as reflection detecting coil L1 and transmission detecting coil L2, at least one wound type chip inductor can respond to each of first portion (core portion) K1 and second portion (ring portion) K2, when coin K is the bicolor coin previously described. That is, magnetic signals corresponding to fine portions of the bicolor coin can be reliably extracted.

As illustrated in FIG. 4 and FIG. 5, in circuit board T, excitation coil LX and a plurality of detecting coils L (L1, L2) are disposed.

By mounting excitation coil LX and a plurality of detecting coils L that are detection elements on circuit board T in this way, it is also possible to mount processing section W on the same circuit board T, and a magnetic sensor excellent in noise resistance without requiring a harness can be configured.

In more detail, a plurality of detecting coils L (L1, L2) are disposed on first circuit board surface T1 of circuit board T adjacently to opening portion A (transport path R) of circuit board T as illustrated in FIG. 3 and FIG. 4, for example.

Transport path R is disposed to penetrate through opening portion A of circuit board T, and is disposed such that first direction (transport direction) G1 which is a transport direction is perpendicular to circuit board surfaces T1 and T2 of circuit board T.

On circuit board T, processing section W, control unit CON, storage unit M and communication unit 50 may be disposed (integrated).

Thereby, it becomes possible to mount processing section W and the like adjacently to sensor section Y. In particular, sensor section Y, processing section W and the like are mounted on circuit board T in which circuit board surfaces T1 and T2 are perpendicular to first direction G1 which is the transport direction, so that it becomes possible to make magnetic detection apparatus 100 compact with respect to the transport direction of coin K.

As illustrated in FIG. 7, a plurality of detecting coils L (L1, L2) may be also disposed (for example, disposed in a zigzag fashion) on second circuit board surface T2 on a back side of first circuit board surface T1 of circuit board T, adjacently to opening portion A (transport path R) of circuit board T.

Thereby, a larger number of detecting coils L (L1 and L2) can be disposed with respect to transport path R with a predetermined width, so that detection precision can be enhanced.

Detecting coils L (L1, L2) are, for example, wound type chip inductors. The wound-type chip inductor is a passive electronic component that can store electric energy in the form of magnetism, and basically has a structure in which a conducting wire (coil) is wound on a magnetic material (core). The wound type chip inductor can be mounted with high density. For example, as illustrated in FIG. 4, by densely mounting the wound type chip inductors on circuit board T, a magnetic sensor that can extract magnetic signals of fine portions can be realized.

A width of the wound type chip inductor in second direction G2 is 0.3 mm to 3.0 mm, for example. In this case, when coin K is the bicolor coin previously described, at least one wound type chip inductor can be caused to respond to each of first portion (core portion) K1 and second portion (ring portion) K2. That is, magnetic signals corresponding to fine portions of the bicolor coin can be reliably extracted.

A plurality of detecting coils L (L1, L2) that are wound type chip inductors may be disposed in second direction G2 so as to respond to an entire width (second direction G2) of transport path R, for example.

Thereby, resolution can be enhanced by using fine wound type chip inductors, and no matter in which position of transport path R the bicolor coin is transported, the composite members of the bicolor coin always pass through a vicinity of one of the wound type chip inductors. Thereby, transport unit F does not need a transport mechanism on one side, so that the configuration becomes simple, and magnetic detection apparatus 100 can obtain stable output without depending on transport on one side.

Figure 9:
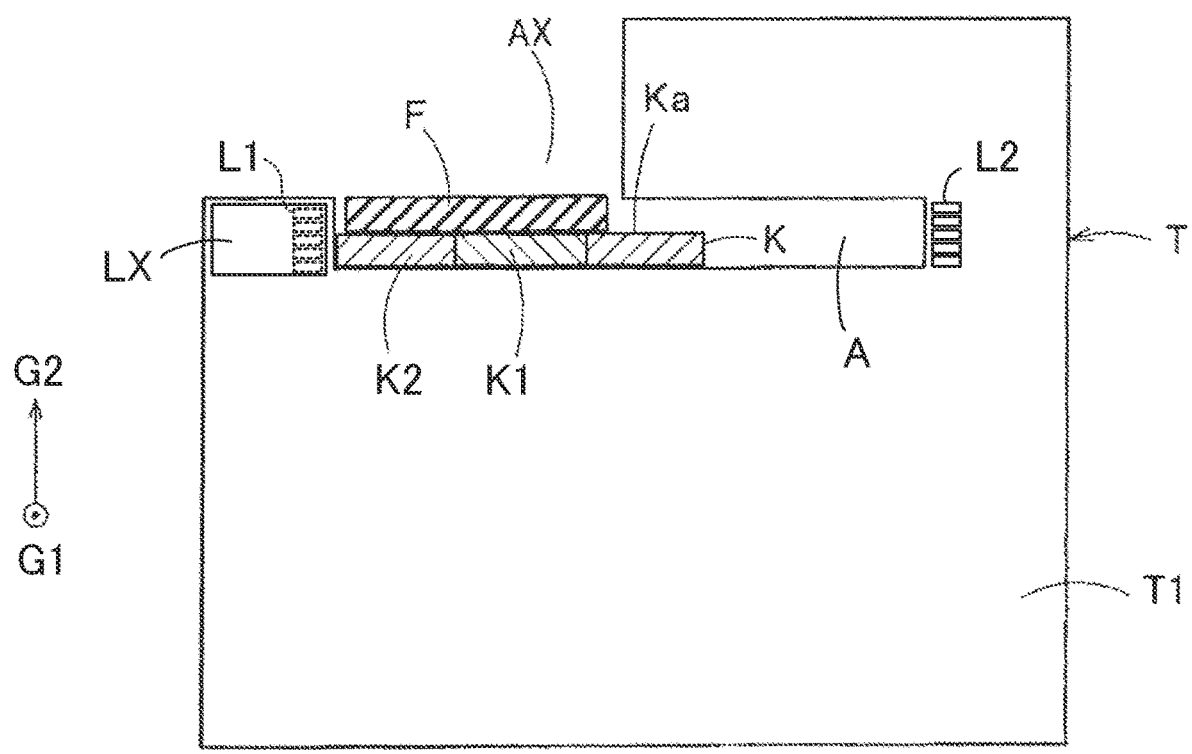
FIG. 9 is a schematic view illustrating another example of the configuration in which the excitation coil is disposed in the circuit board seen from a first direction.

Second direction G2 previously described may be orthogonal to first direction G1 and may be orthogonal to transport path surface Ra of transport path R as illustrated in FIG. 9. That is, in this case, a plurality of detecting coils L (L1, L2) are disposed at side portions of opening portion A.

Thereby, when coin K is the bicolor coin of a clad structure previously described, for example, a plurality of detecting coils L (L1, L2) can be caused to respond to each of the different materials. That is, magnetic signals corresponding to fine portions of the bicolor coin can be reliably extracted.

As illustrated in FIG. 2, processing section W acquires the detection signals outputted by sensor section Y, processes the detection signals and outputs determining signal Sout.

Processing section W includes reflection side amplifier AMP1, reflection side low-pass filter LPF1, reflection side high-pass filter HPF1, reflection side rectifying and smoothing circuit RE1, reflection side AD conversion circuit ADC1, transmission side amplifier AMP2, transmission side low-pass filter LPF2, transmission side high-pass filter HPF2, transmission side rectifying and smoothing circuit RE2, transmission side AD conversion circuit ADC2, and determination circuit DC as illustrated in FIG. 2, for example.

Reflection side amplifier AMP1 amplifies detection signal S21 outputted by reflection detecting coil L1.

Reflection side low-pass filter LPF1 filters detection signal S21 which is amplified by reflection side amplifier AMP1, and outputs a low-frequency component (signal S31) of amplified detection signal S21.

For example, reflection side low-pass filter LPF1 hardly attenuates components of lower frequencies than a cut-off frequency specified in advance, and gradually decreases components of higher frequencies than the cut-off frequency, with respect to amplified detection signal S21.

Reflection side high-pass filter HPF1 filters detection signal S21 which is amplified by reflection side amplifier AMP1, and outputs high-frequency components (signal S41) of amplified detection signal S21. Reflection side high-pass filter HPF1 may be a BPF (band pass filter) circuit.

For example, reflection side high-pass filter HPF1 hardly attenuates components of higher frequencies than a cut-off frequency specified in advance, and gradually decreases components of lower frequencies than the cut-off frequency, with respect to detection signal S21.

Reflection side rectifying and smoothing circuit RE1 rectifies and smoothes signal S41 which is outputted by reflection side high-pass filter HPF1, and outputs signal S51.

Reflection side AD conversion circuit ADC1 outputs a digital signal obtained by subjecting signal S31 outputted by reflection side low-pass filter LPF1 and signal S51 outputted by reflection side rectifying and smoothing circuit RE1 to analog/digital conversion.

Transmission side amplifier AMP2 amplifies detection signal S22 which is outputted by transmission detecting coil L2.

Transmission side low-pass filter LPF2 filters detection signal S22 which is amplified by transmission side amplifier AMP2, and outputs low-frequency components (signal S32) of amplified detection signal S22.

For example, transmission side low-pass filter LPF2 hardly attenuates components of lower frequencies than a cut-off frequency specified in advance, and gradually decreases components of higher frequencies than the cut-off frequency, with respect to amplified detection signal S22.

Transmission side high-pass filter HPF2 filters detection signal S22 which is amplified by transmission side amplifier AMP2, and outputs high-frequency components (signal S42) of amplified detection signal S22. Transmission side high-pass filter HPF2 may be a BPF (band pass filter) circuit.

For example, transmission side high-pass filter HPF2 hardly attenuates components of higher frequencies than a cut-off frequency specified in advance, and gradually decreases components of lower frequencies than the cut-off frequency, with respect to amplified detection signal S22.

Transmission side rectifying and smoothing circuit RE2 rectifies and smoothes signal S42 outputted by transmission side high-pass filter HPF2 and outputs signal S52.

Transmission side AD conversion circuit ADC2 outputs a digital signal obtained by subjecting signal S32 outputted by transmission side low-pass filter LPF2 and signal S52 outputted by transmission side rectifying and smoothing circuit RE2 to analog/digital conversion.

Determination circuit DC processes the digital signals which are outputted by reflection side AD conversion circuit ADC1 and transmission side AD conversion circuit ADC2, and outputs determination signal Sout.

That is, the magnetic detection apparatus 100 applies a magnetic field to coin K which is transported on the transport path, and outputs determination signal Sout based on a detection signal based on the induced voltage by the magnetic field.

Subsequently, as described previously, control unit CON recognizes the kind and the like of coin K which is an object to be detected, based on determination signal Sout outputted by magnetic detection unit D of magnetic detection apparatus 100.

Figure 10:
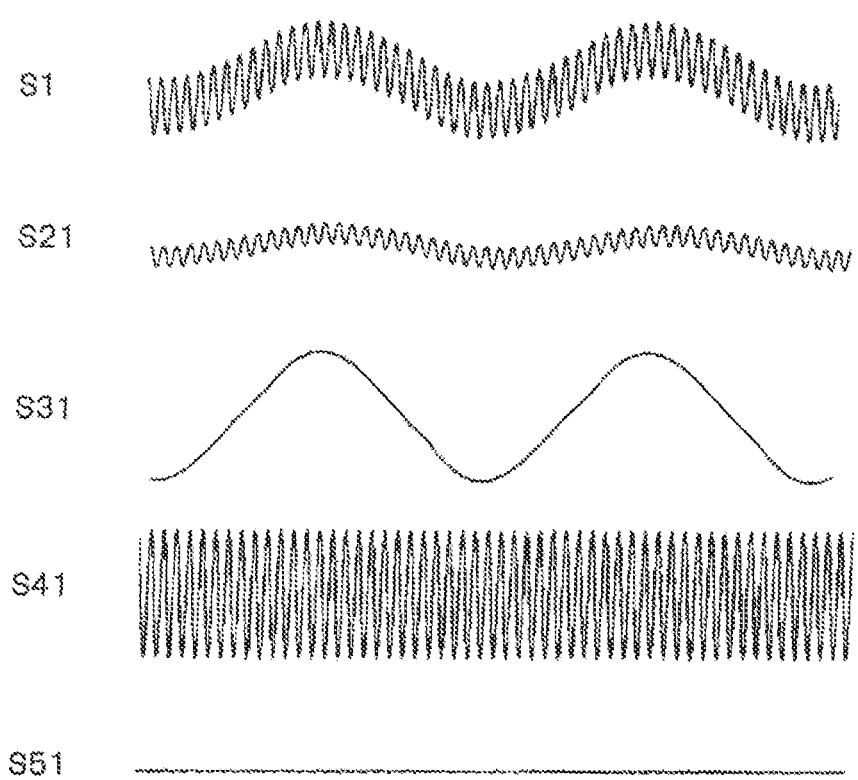
FIG. 10 is a diagram illustrating an example of each of signal waveforms in a case where coin is not transported, of a magnetic detection unit of the magnetic detection apparatus illustrated in FIG. 2.

Next, an operation (magnetic detection method) of magnetic detection apparatus 100 having the configuration as above will be described. FIG. 10 is a diagram illustrating examples of respective signal waveforms in the case where coin K is not transported of magnetic detection unit D of magnetic detection apparatus 100 illustrated in FIG. 2.

FIG. 10 illustrates the respective signal waveforms at the reflection side as examples, and the same applies to signal waveforms at the transmission side.

As illustrated in FIG. 10, AC voltage S1 is an AC voltage (composite signal) including two characteristic frequencies. AC voltage (composite signal) S1 which is outputted by AC power supply Z is applied to excitation coil LX, and excitation coil LX generates magnetic field MF in transport path R.

Reflection detecting coil L1 induces an induced voltage by magnetic field MF generated by excitation coil LX, and outputs detection signal S21 based on the induced voltage.

Reflection side low-pass filter LPF1 filters detection signal S21 amplified by reflection side amplifier AMP1, and outputs a low-frequency component (signal S31) of amplified detection signal S21.

Reflection side high-pass filter HPF1 filters detection signal S21 amplified by reflection side amplifier AMP1, and outputs a high-frequency component (signal S41) of amplified detection signal S21.

Reflection side rectifying and smoothing circuit RE1 rectifies and smoothes signal S41 outputted by reflection side high-pass filter HPF1 and outputs signal S51.

As illustrated in FIG. 10, coin K is not transported, so that a period of signal S31 of a low-frequency component is fixed, and signal S51 obtained by rectifying and smoothing a high-frequency component is fixed.

Here, when detection signals S21 and S22 of a plurality of detecting coils L vary due to passage of coin K which is transported, signals S31 and S51 vary.

In this way, magnetic detection apparatus 100 outputs determination signal Sout for recognizing coin K by using the fact that detection signals S21 and S22 of a plurality of detecting coils L vary due to passage of coin K which is transported.

Figure 11:
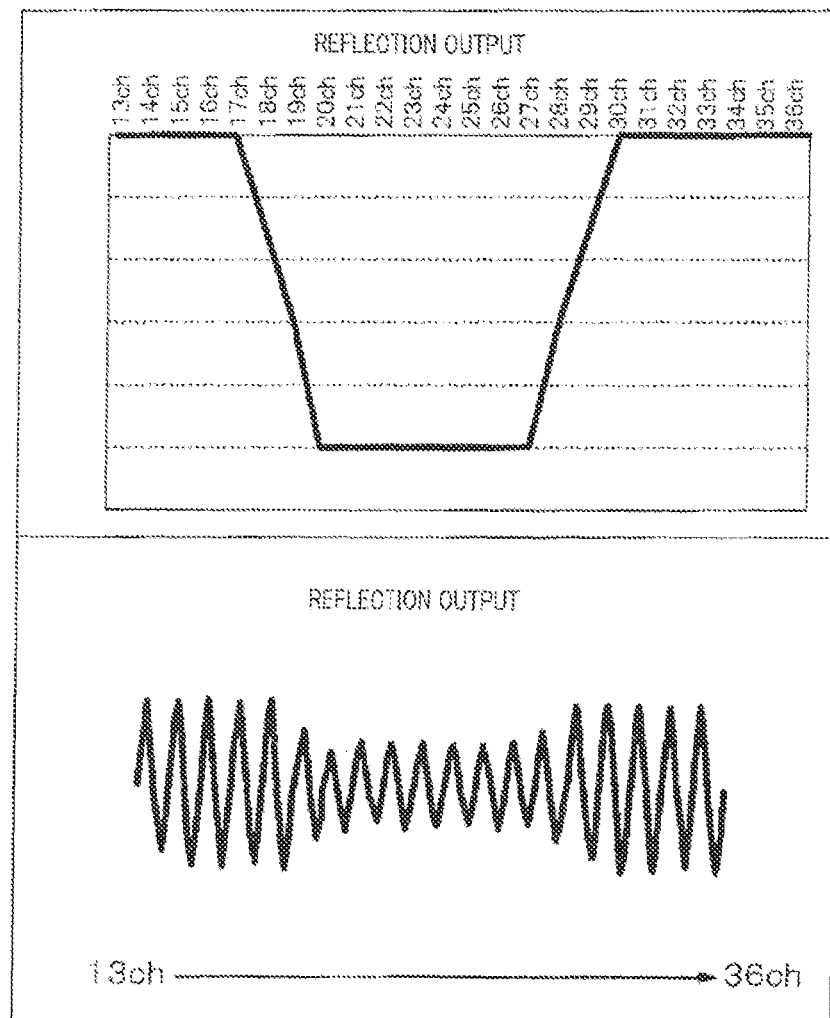
FIG. 11 is a diagram illustrating a reflection output (top) after rectification corresponding to a high-frequency signal and a reflection output (bottom) corresponding to a low-frequency signal.
Figure 12:
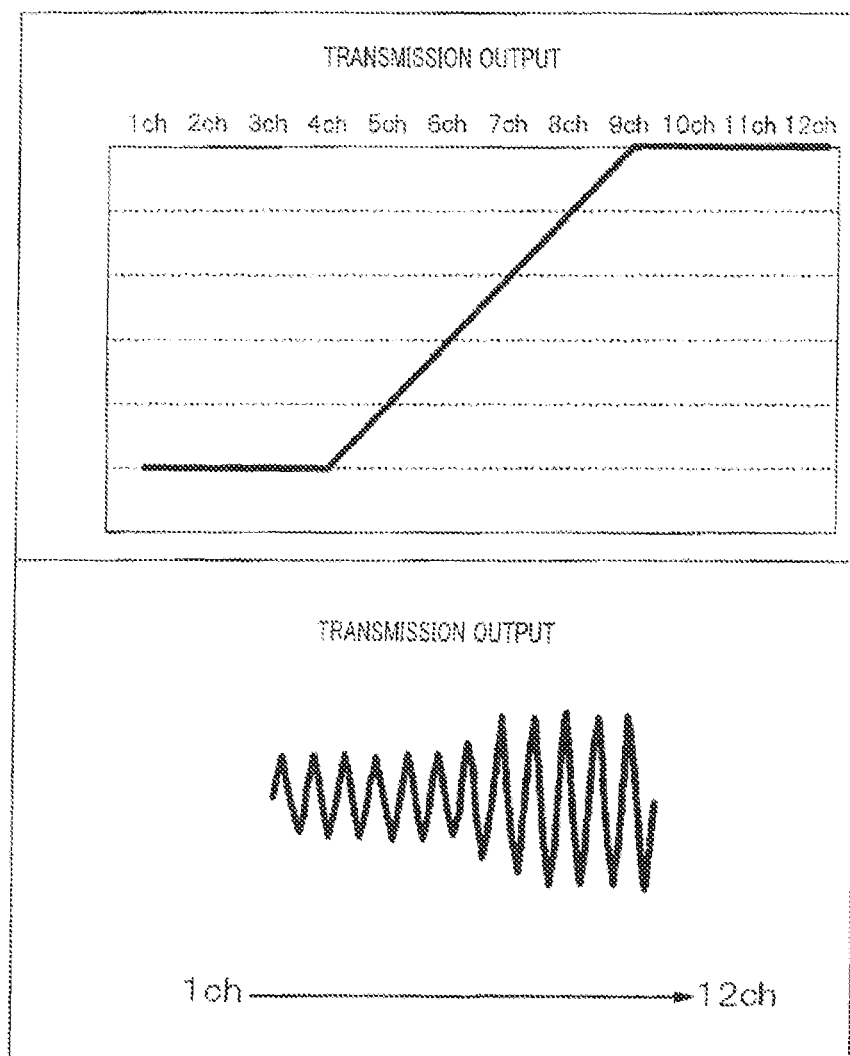
FIG. 12 is a diagram illustrating a transmission output (top) after rectification corresponding to a high-frequency signal and a transmission output (bottom) corresponding to a low-frequency signal.

Next, FIG. 11 is a diagram illustrating a reflection output (top) after rectification corresponding to signal S51 of high frequency, and a reflection output (bottom) corresponding to signal S31 of low frequency. FIG. 12 is a diagram illustrating a transmission output (top) after rectification corresponding to signal S52 of high frequency, and a transmission output (bottom) corresponding to signal S32 of low frequency. In FIGS. 11, 13*ch* to 36*ch* correspond to a plurality (24) of reflection detecting coils L1, and in FIGS. 12, 1*ch* to 12*ch* corresponds to a plurality (12) of transmission detecting coils L2.

As illustrated in FIG. 11, detection signals S21 of a plurality of reflection detecting coils L1 vary due to passage of coin K which is transported, and thereby reflection outputs after rectification corresponding to signals S51 of high frequency and reflection outputs corresponding to signals S31 of low frequency of reflection detecting coils L1 of 18*ch* to 29*ch* change.

In this way, detection signals S21 of a plurality of reflection detecting coils L1 vary due to passage of coin K which is transported, an output corresponding to an outer shape of coin K and an output corresponding to materials of coin K can be obtained. That is, the output corresponding to the outer shape is obtained by using the outputs obtained outside of coin (medium) K. The output corresponding to the materials can be obtained by an output of a center portion of coin K. Thereby, it becomes possible to obtain outputs of different materials as in the bicolor coin.

As illustrated in FIG. 12, detection signals S22 of a plurality of transmission detecting coils L2 vary due to passage of coin K which is transported, and thereby reflection outputs after rectification corresponding to signals S52 of high frequency and reflection outputs corresponding to signals S32 of low frequency of transmission detecting coils L2 of 1ch to 8ch change.

When the outputs at the transmission side which are obtained in this way are added, it becomes further possible to obtain the output corresponding to the outer shape and the output corresponding to the material, and performance is enhanced. Thereby, it becomes possible to use determination using outputs at both the transmission side and the reflection side.

As described above, magnetic detection apparatus 100 can perform coin recognition using the fact that detection signals S21 and S22 of a plurality of detecting coils L vary due to passage of coin K which is transported, with high precision.

As described previously, a plurality of detecting coils L (L1, L2) respectively output detection signals S21 and S22 based on the induced voltage which is induced in accordance with magnetic field MF at the time of at least the center of coin K passing through opening portion A of circuit board T. Processing section W outputs determination signal Sout by using detection signals S21 and S22. Control unit CON recognizes the kind and the like of coin K which is an object to be detected based on determination signal Sout, and thereby does not have to adjust timings for acquiring the respective signals. Thereby, a processing speed of control unit CON can be increased.

As above, according to the magnetic detection apparatus, the coin recognition unit and the magnetic detection method of the magnetic detection apparatus according to the present embodiment, fine portions of a coin can be stably detected while the configuration of the magnetic detection apparatus is simplified.

Modified Examples

Figure 13:
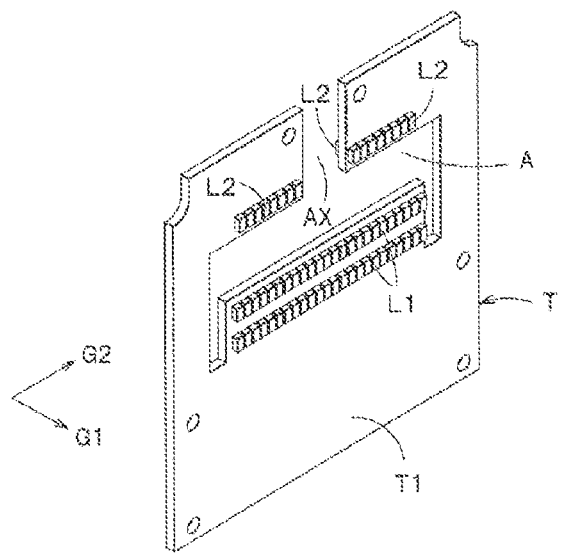
FIG. 13 is a perspective view illustrating an example of an outer appearance of a circuit board according to a modified example.
Figure 14:
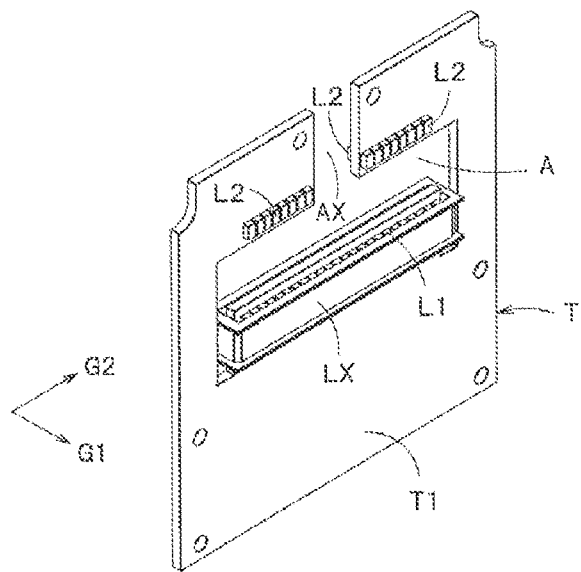
FIG. 14 is a perspective view illustrating an example of a configuration in which an excitation coil is disposed in the circuit board illustrated in FIG. 13.
Figure 15:
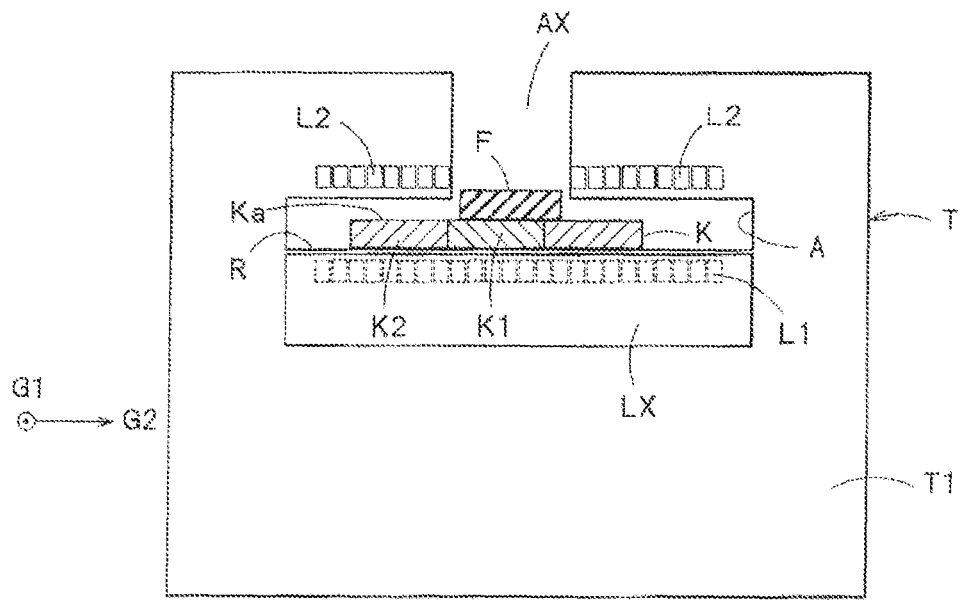
FIG. 15 is a schematic view of the configuration in which the excitation coil is disposed in the circuit board illustrated in FIG. 13 seen from the first direction.

Here, the configuration of circuit board T of magnetic detection apparatus 100 described in the embodiment previously described, and the configurations of excitation coil LX and a plurality of detecting coils L (L1, L2) which are disposed in circuit board T are only examples, and the present invention is not limited to these configurations. That is, a configuration of circuit board T as follows, and configurations of excitation coil LX and a plurality of detecting coils L (L1, L2) which are disposed in circuit board T are also applied to magnetic detection apparatus 100. Further, it is also possible to use the detecting coils by switching the detecting coils to perform excitation FIG. 13 is a perspective view illustrating an example of an outer appearance of circuit board T according to a modified example. FIG. 14 is a perspective view illustrating an example of a configuration in which excitation coil LX is disposed in circuit board T illustrated in FIG. 13. FIG. 15 is a schematic view of the configuration in which excitation coil LX is disposed in circuit board T illustrated in FIG. 13 seen from first direction G1.

As illustrated in FIG. 13 to FIG. 15, a plurality of reflection detecting coils L1 may be disposed in two rows on circuit board T in second direction G2. Similarly, a plurality of transmission detecting coils L2 may be disposed in two columns on circuit board T in second direction G2. Thereby, detection precision can be enhanced.

As illustrated in FIG. 15, transport unit F may be disposed in area AX connecting to opening portion A and facing a center of transport path R.

Figure 16:
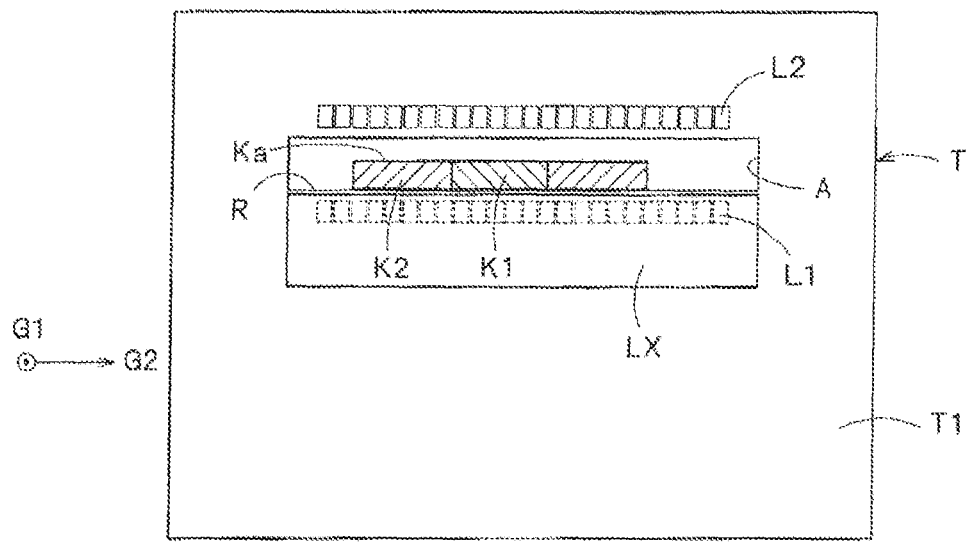
FIG. 16 is a schematic view of a configuration in which the excitation coil is disposed in a circuit board according to a modified example seen from the first direction.

FIG. 16 is a schematic view of a configuration in which excitation coil LX is disposed in circuit board T according to a modified example seen from first direction G1.

As illustrated in FIG. 16, transport unit F may be omitted. In this case, coin K is pushed out on transport path R by an extrusion mechanism or the like, or rolls by an own weight to pass through transport path R.

Figure 17:
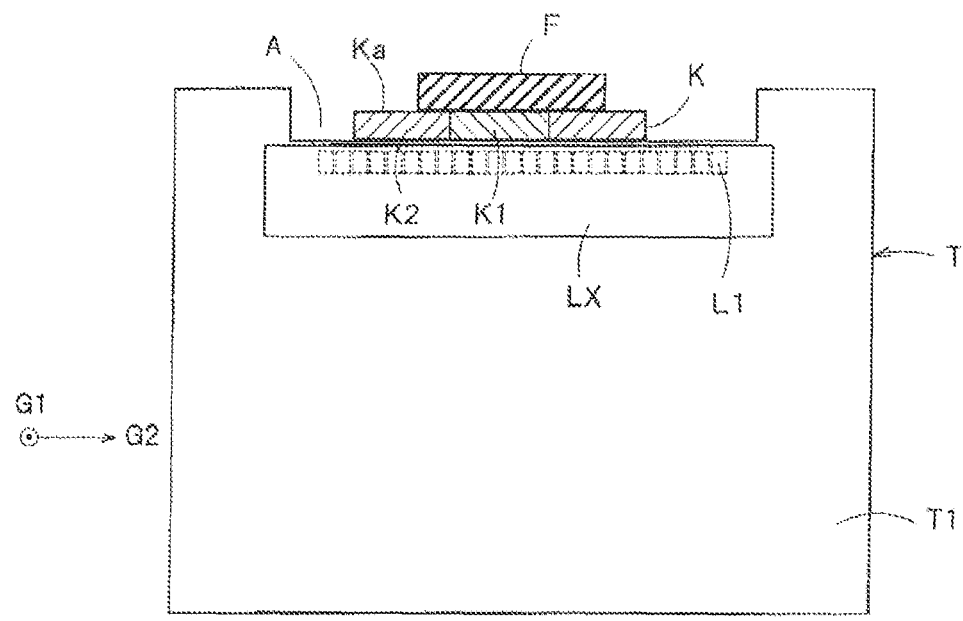
FIG. 17 is a schematic view of a configuration in which the excitation coil is disposed in a circuit board according to a modified example seen from the first direction.

FIG. 17 is a schematic view of a configuration in which excitation coil LX is disposed on circuit board T according to a modified example seen from a first direction G1.

As illustrated in FIG. 17, transmission detecting coil L2 may be omitted.

Figure 18:
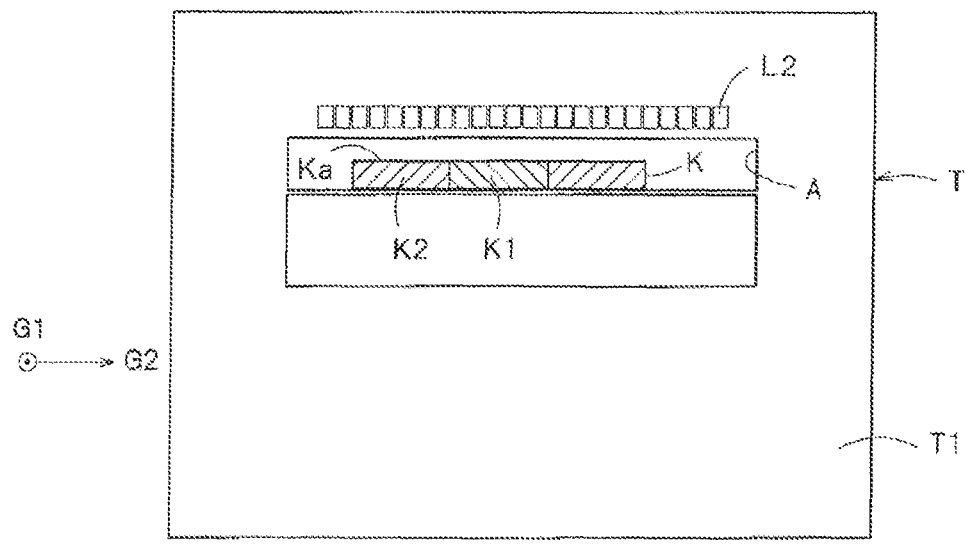
FIG. 18 is a schematic view of a configuration in which the excitation coil is disposed in a circuit board according to a modified example seen from the first direction.

FIG. 18 is a schematic view of a configuration in which excitation coil LX is disposed in circuit board T according to a modified example seen from first direction G1.

As illustrated in FIG. 18, reflection detecting coil L1 may be omitted.

While several embodiments of the present invention are described thus far, these embodiments are presented by way of example, and are not intended to limit the scope of the present invention. These embodiments can be carried out in various other modes, and various omissions, substitutions and changes can be made within the range without departing from the spirit of the invention. These embodiments and the modifications are included in the range of the invention described in the claims and the equivalents as well as included in the range and the spirit of the invention.

The disclosure of Japanese Patent Application No. 2016-062333 filed in Mar. 25, 2016 including the specification, drawings and abstract is incorporated herein by reference in its entirety.

REFERENCE SIGNS LIST

1000 Coin recognition unit
100 Magnetic detection apparatus
CON Control unit
M Storage unit
D Magnetic detection unit
F Transport unit
10 Coin recognition unit
20 Transport control section
30 Magnetic detection control section
40 Processing section
50 Communication unit
AMP1 Reflection side amplifier
LPF1 Reflection side low-pass filter
HPF1 Reflection side high-pass filter
RE1 Reflection side rectifying and smoothing circuit
ADC1 Reflection side AD conversion circuit
AMP2 Transmission side amplifier
LPF2 Transmission side low-pass filter
HPF2 Transmission side high-pass filter
RE2 Transmission side rectifying and smoothing circuit
ADC2 Transmission side AD conversion circuit
DC Determination circuit

The invention claimed is:
1. A magnetic detection apparatus, comprising:
an excitation coil that generates an AC magnetic field in a transport path on which coin is transported in a first direction; and a plurality of detecting coils disposed side by side at pitches set in advance in a second direction, and outputting detection signals based on an induced voltage by the AC magnetic field, wherein the plurality of detecting coils respectively output detection signals, based on an inducted voltage induced by the AC magnetic field that is changed by the coin being transported on the transport path, and the plurality of detecting coils includes a plurality of reflection detecting coils and a plurality of transmission detecting coils.

2. The magnetic detection apparatus according to claim 1, wherein the excitation coil is disposed on an opposite side to a transport path surface of the transport path, the transport path surface being where the coin is transported.

3. The magnetic detection apparatus according to claim 1, wherein the plurality of reflection detecting coils are disposed on an opposite side to a transport path surface of the transport path, the transport path surface being where the coin is transported.

4. The magnetic detection apparatus according to claim 1, wherein the plurality of transmission detecting coils are disposed on a transport path surface side of the transport path, the transport path surface side being where the coin is transported.

5. The magnetic detection apparatus according to claim 1, wherein the plurality of detecting coils are disposed to be parallel with a transport path surface of the transport path, and the coin is transported such that a coin surface is parallel with a transport path surface of the transport path.

6. The magnetic detection apparatus according to claim 1, wherein the plurality of detecting coils are orthogonal to the first direction, and are parallel with a transport path surface of the transport path.

7. The magnetic detection apparatus according to claim 1, wherein the plurality of detecting coils are orthogonal to the first direction, and are perpendicular to a transport path surface of the transport path.

8. The magnetic detection apparatus according to claim 1, wherein the coin has a first portion and a second portion of a different material divided concentrically, the first portion being nearer to a central position and the second portion being at an outer side, and the respective plurality of detecting coils are disposed at pitches smaller than a width of the second portion in a radial direction.

9. The magnetic detection apparatus according to claim 1, wherein the pitches are 0.2 mm to 3.0 mm.

10. The magnetic detection apparatus according to claim 1, wherein the transport path is disposed to penetrate through an opening portion provided in a circuit board, and the excitation coil and the plurality of detecting coils are disposed in the circuit board.

11. The magnetic detection apparatus according to claim 10, wherein the plurality of detecting coils are disposed on a first circuit board surface of the circuit board.

12. The magnetic detection apparatus according to claim 11, wherein the plurality of detecting coils are also disposed on a second circuit board surface on a back side of the first circuit board surface of the circuit board.

13. The magnetic detection apparatus according to claim 10, wherein the circuit board has an AC power supply that supplies an AC voltage to the excitation coil.

14. The magnetic detection apparatus according to claim 10, wherein the plurality of detecting coils respectively output detection signals based on an induced voltage induced in accordance with the AC magnetic field at a time of a center of the coin passing through the opening portion of the circuit board.

15. The magnetic detection apparatus according to claim 1, wherein the excitation coil is wound to surround a plurality of detecting cores on which the plurality of detecting coils are respectively wound and the plurality of detecting coils.

16. The magnetic detection apparatus according to claim 1, wherein the excitation coil is a single coil.

17. The magnetic detection apparatus according to claim 1, wherein each of the plurality of detecting coils is configured by a wound type chip inductor.

18. The magnetic detection apparatus according to claim 17, wherein a width of the wound type chip inductor is 0.3 mm to 3.0 mm.

19. The magnetic detection apparatus according to claim 1, wherein the plurality of detecting coils are disposed on an entire width of the transport path.

20. A coin recognition unit comprising:
the magnetic detection apparatus according to claim 1.

21. A magnetic detection method comprising:
generating an AC magnetic field in a transport path on which coin is transported in a first direction; and
outputting detection signals based on an induced voltage by the AC magnetic field, by a plurality of detecting coils disposed side by side at pitches which are set in advance, in a second direction, wherein the plurality of detecting coils includes a plurality of reflection detecting coils and a plurality of transmission detecting coils,
wherein in outputting the detection signals, the respective plurality of detecting coils output the detection signals based on an induced voltage induced by the AC magnetic field which is changed by the coin being transported through the transport path.

* * * * *